(12) United States Patent
Stilianos et al.

(10) Patent No.: US 10,785,881 B2
(45) Date of Patent: Sep. 22, 2020

(54) BONDED ELECTRONIC CONTROL UNIT

(71) Applicant: VEONEER US INC., Southfield, MI (US)

(72) Inventors: Demetri Stilianos, Howell, MI (US); Jacob Jay Yoder, Dundee, MI (US); Luis Fernando Sanchez, Commerce Twp., MI (US); Floyd J. Malecke, South Lyon, MI (US)

(73) Assignee: VEONEER US INC., Southfield, MI (US)

( * ) Notice: Subject to any disclaimer, the term of this patent is extended or adjusted under 35 U.S.C. 154(b) by 0 days.

(21) Appl. No.: 16/253,729

(22) Filed: Jan. 22, 2019

(65) Prior Publication Data

US 2020/0236797 A1    Jul. 23, 2020

(51) Int. Cl.
| | | |
|---|---|---|
| H01R 12/00 | (2006.01) |
| H05K 5/00 | (2006.01) |
| H05K 5/06 | (2006.01) |
| B60R 16/023 | (2006.01) |
| H05K 1/02 | (2006.01) |
| H05K 9/00 | (2006.01) |

(52) U.S. Cl.
CPC ......... *H05K 5/0052* (2013.01); *H05K 5/0056* (2013.01); *H05K 5/0069* (2013.01); *H05K 5/061* (2013.01); *H05K 5/066* (2013.01); *H05K 5/069* (2013.01); *B60R 16/0239* (2013.01); *H05K 1/0215* (2013.01); *H05K 5/006* (2013.01); *H05K 9/0022* (2013.01)

(58) Field of Classification Search
CPC .... H05K 5/0052; H05K 5/0056; H05K 5/061; H05K 5/0069; H05K 5/066; H05K 9/0022; H01R 12/724; H01R 9/032; H01R 13/6581; H01R 13/405
USPC ......................................................... 439/76.1
See application file for complete search history.

(56) References Cited

U.S. PATENT DOCUMENTS

| | | | |
|---|---|---|---|
| 5,703,754 A | 12/1997 | Hinze | |
| 9,263,834 B2 * | 2/2016 | Tang | ................... H01R 13/6581 |
| 9,293,870 B1 | 3/2016 | Koczwara et al. | |
| 2010/0009569 A1 * | 1/2010 | Su | ........................ H01R 9/032 |
| | | | 439/552 |
| 2012/0276761 A1 * | 11/2012 | Martin | ................. H01R 12/724 |
| | | | 439/83 |
| 2012/0320544 A1 | 12/2012 | Ohhashi et al. | |
| 2014/0334116 A1 | 11/2014 | Lee et al. | |

(Continued)

FOREIGN PATENT DOCUMENTS

| | | |
|---|---|---|
| EP | 1806960 | 7/2007 |
| JP | 2003063325 | 3/2003 |

*Primary Examiner* — Jean F Duverne
(74) *Attorney, Agent, or Firm* — Christopher P. Maiorana, PC

(57) ABSTRACT

An apparatus includes a housing, a circuit board, a sealant and a baseplate. The housing may have a shelf and a flange along an open side. The circuit board may be (i) disposed on the shelf of the housing and inside the flange of the housing and (ii) secured to the housing. The sealant may be dispensed (i) through the open side of the housing and (ii) along a gap between the flange and the circuit board. The baseplate may be compressed to the housing thereby causing the sealant to flow between (i) the baseplate and the circuit board and (ii) the baseplate and the flange.

20 Claims, 13 Drawing Sheets

(56) References Cited

U.S. PATENT DOCUMENTS

2017/0098907 A1\* 4/2017 Liang .................. H01R 13/405
2018/0109027 A1 4/2018 Kaneko et al.

\* cited by examiner

BONDED ELECTRONIC CONTROL UNIT

FIELD OF THE INVENTION

The invention relates to automotive control assemblies generally and, more particularly, to a method and/or apparatus for implementing a bonded electronic control unit.

BACKGROUND

Manufactures commonly specify sealing levels for fully assembled electronic modules. One or more connectors are conventionally included on the electronic modules to make electrical contact between printed circuit boards within the modules and vehicle harnesses outside the modules. Possible leak paths between the connectors and electronic module housings are commonly sealed with dispensed seals or gaskets.

Current electronic module designs use plastic housings and bases or a rubber gasket to seal the bases to the housings. The electronic modules also use potting or bonding components outside the housings to fill gaps. The design approaches are expensive and have other shortcomings.

It would be desirable to implement a bonded electronic control unit.

SUMMARY

The invention concerns an apparatus including a housing, a circuit board, a sealant and a baseplate. The housing may have a shelf and a flange along an open side. The circuit board may be (i) disposed on the shelf of the housing and inside the flange of the housing and (ii) secured to the housing. The sealant may be dispensed (i) through the open side of the housing and (ii) along a gap between the flange and the circuit board. The baseplate may be compressed to the housing thereby causing the sealant to flow between (i) the baseplate and the circuit board and (ii) the baseplate and the flange.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a bonded electronic control unit that may (i) be cost effective, (ii) improve sealing performance, (iii) improve mechanical transfer function performance, (iv) improve electromagnetic compatibility performance, (v) be lower in cost than similar housings where the connectors are overmolded in the housings, (vi) provide increased area for electronic components, (vii) simplify assembly line fabrication, (viii) provide a robust seal between the housings and the connectors, (ix) provide no movement between the connectors and the housing during welding, (x) provide spring-loaded welds, (xi) provide a strong housing assembly and/or (xii) be assembled without screws.

In various embodiments of the invention, a connector with compliant pins may be assembled to a printed circuit board. The resulting subassembly may be secured (e.g., welded and/or glued) to a box housing having four closed sides. The subassembly secured to the housing generally forms a five-sided housing. The connector may be completely sealed to the housing.

A sealant that bonds with the housing, the subassembly (e.g., printed circuit board and connector) and a baseplate may be used to hold together various components of the electronic control unit. The sealant generally seals the electronic control unit and provides bonding (or fastening) among the components. Since a significant peripheral area of the printed circuit board is bonded between the housing and the baseplate, common fasteners used to mount the printed circuit board may be eliminated in various embodiments. In other embodiments, a number of fasteners and/or locations of the fasteners may be reduced and/or shifted to avoid hampering a performance of the module.

Figure 1:
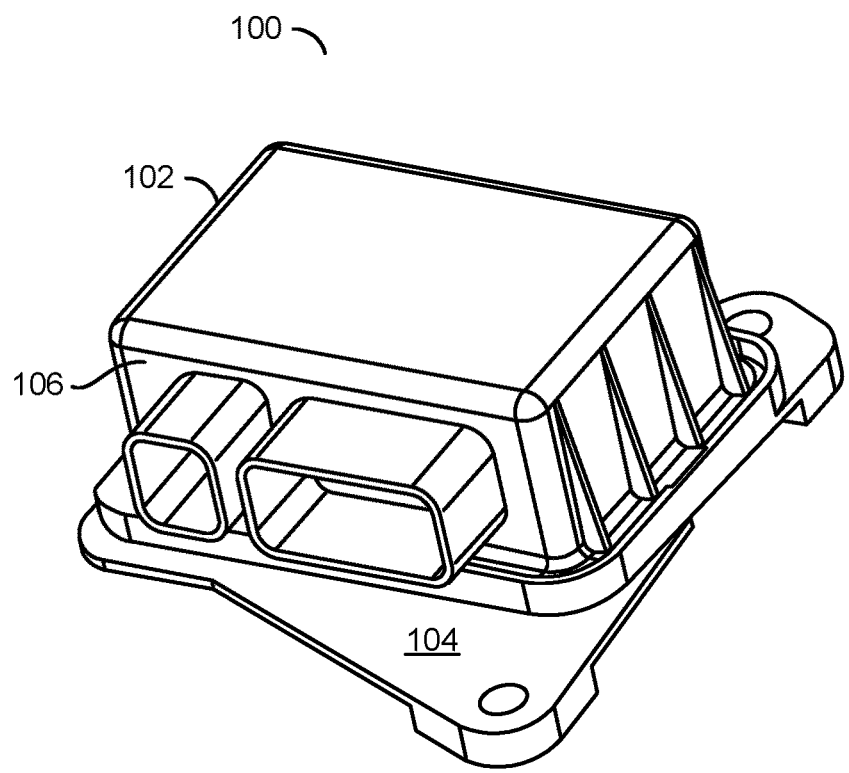
FIG. 1 is a diagram illustrating a perspective view of an apparatus in accordance with an example embodiment of the invention.

Referring to FIG. 1, a diagram is shown illustrating a perspective view of an apparatus 100 in accordance with an example embodiment of the invention. In various embodiments, the apparatus 100 may implement an electronic control unit (or module). The apparatus 100 generally comprises an upper housing 102, a lower housing (or cover or baseplate) 104 and a subassembly 106.

The upper housing 102 may be implemented as a nonconductive enclosure. While mated with the lower housing 104 and the subassembly 106, the upper housing 102 may configured to provide an environmentally sealed enclosure. The enclosure may protect components and devices of the subassembly 106. In upper housing 102 generally comprises a plastic or resin-based material. In various embodiments, the plastic material may include, but is not limited to polyamide (NYLON), polybutylene terephthalate (PBT), polypropylene, polyethylene terephthalate (PET), acrylonitrile butadiene styrene (ABS), and/or various alloys and/or fillers of the resins. Other materials may be implemented to meet the design criteria of a particular application.

The lower housing 104 may be implemented as an electrically conductive baseplate. The lower housing 104 is generally configured to provide mechanical support, thermal cooling and electrical grounding for the apparatus 100. In various embodiments, the lower housing 104 may comprise a die-cast Aluminum baseplate. In another example, the baseplate 104 may be implemented as a stamped steel baseplate. Implementing the baseplate 104 with a metallic material may aid in dissipating heat generated by circuitry within the apparatus 100. The baseplate 104 is generally configured to provide a mounting footprint for the apparatus 100. In an example, the baseplate 104 may be implemented with an RCM8 mounting footprint to simplify testing. However, other footprints may be implemented to meet the design criteria of a particular application.

The subassembly (or electrical assembly) 106 may implement an electronic component of the apparatus 100. The subassembly 106 may be operational to perform one or more electrical functions. The electrical functions may include, but are not limited to, providing grounding paths for all electrical components inside the apparatus 100 to the exterior of the apparatus 100, transfer electrical inputs from different circuits in the vehicle to electronic components mounted inside the apparatus 100, monitor the performance of electronic sensors in the vehicle and/or transmit acceleration changes in the vehicle to the electronic components mounted in the apparatus 100. In various embodiments, the subassembly 106 generally comprises a plate having one or more integrated connectors attached to one or more printed circuit boards. The plate may be shaped to form a fifth side of the assembly 100 while secured to the upper housing 102. The printed circuit board may contain electrical circuitry configured to perform the electrical functions.

Figure 2:
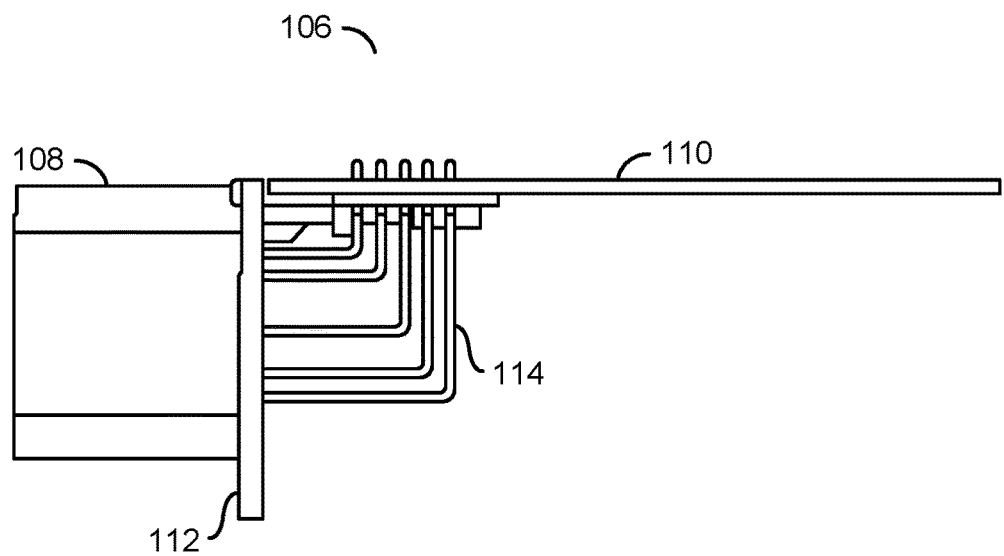
FIG. 2 is a diagram illustrating a subassembly of the apparatus in accordance with an example embodiment of the invention.

Referring to FIG. 2, a diagram illustrating an implementation of the subassembly 106 is shown in accordance with an example embodiment of the invention. The subassembly 106 generally comprises the one or more connectors 108, the one or more printed circuit boards 110, the plate 112 and multiple wires 114. In various embodiments, the plate 112 may be formed integral to the connectors 108 to form a sealed surface. In other embodiments, the plate 112 may be formed separate from the connectors 108 and subsequently joined together as part of the connectors 108. The wires 114 may provide multiple electrical connections between the pins and/or sockets of the connectors 108 and the printed circuit board 110. The wires 114 may also provide mechanical support that holds the printed circuit board 110 approximately perpendicular to the plate 112.

In an example embodiment, the connectors 108 generally comprise a 72-pin connector and a 52-pin connector to provide electrical connections to the printed circuit board 110. In an example, the connectors 108 may be implemented as 1.8 mm pitch Nano connectors. Other numbers of connectors, other numbers of pins and/or other numbers of sockets may be implemented to meet the design criteria of a particular application.

Figure 3:
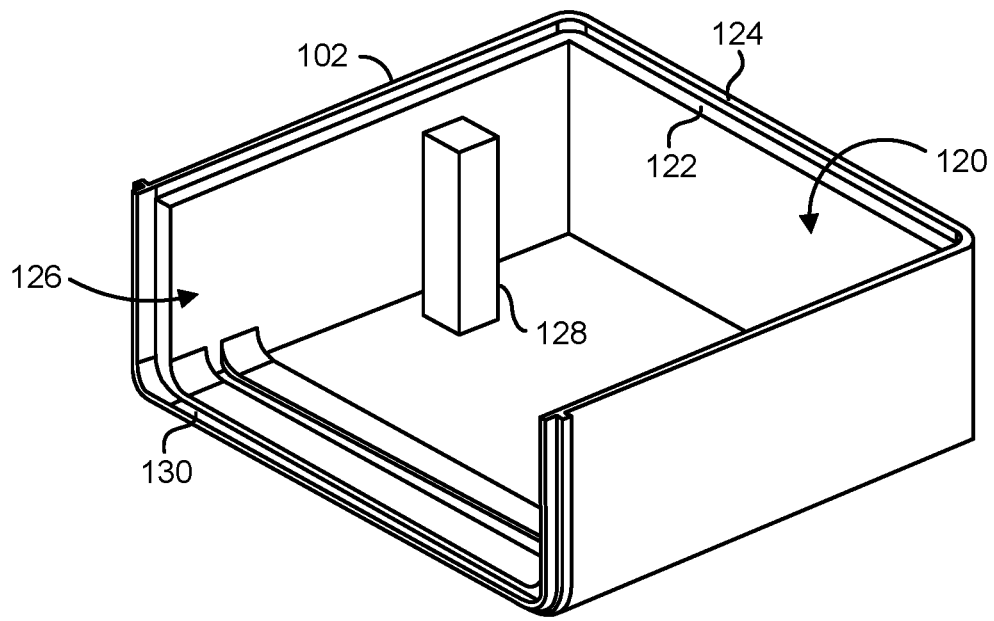
FIG. 3 is a diagram illustrating an upper housing of the apparatus in accordance with an example embodiment of the invention.

Referring to FIG. 3, a diagram illustrating an implementation of the upper housing 102 is shown in accordance with an example embodiment of the invention. The upper housing 102 is generally configured as a multi-sided (e.g., four-sided) enclosure. A side of the upper housing 102 that will neighbor the baseplate 106 may be an open side 120. A side of the upper housing 102 that will accept the subassembly 106 may be an open connector side 126. The open side 120 and the open connector side 126 may be adjoining sides. The other four sides of the upper housing 102 may form the closed sides of the enclosure.

A shelf 122 may be established on the three closed sides adjoining the open side 120. The shelf 122 may be disposed inside the upper housing 102. The shelf 122 may be configured to receive the printed circuit board 110 while the subassembly 106 is secured to the upper housing 102.

A flange 124 may be created in the three close sides adjoining the open side 120. An outer surface of the flange 124 may be planar to mate to the baseplate 104. A height of the flange 124 may be larger than a thickness of the printed circuit board 110 and any of the wires 114 that protrude through the printed circuit board 110.

The open connector side 126 may have an interface 130 shaped to receive the plate 112 of the subassembly 106. In various embodiments, the plate 112 of the subassembly 106 may be configured to completely cover the open connector side 126 of the upper housing 102.

A support surface 128 may be formed inside the upper housing 102. A gap may exist between the support surface 128 and the plane established by the flange 124 to allow space for the printed circuit board 110.

Figure 4:
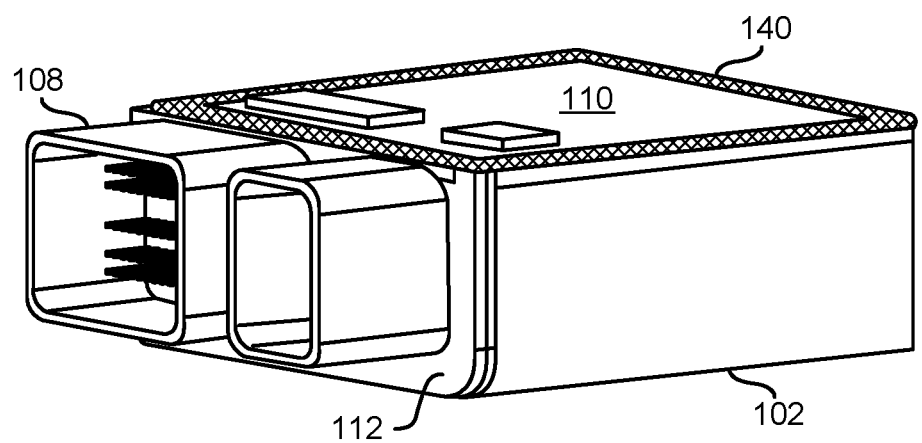
FIG. 4 is a diagram illustrating a partially assembled apparatus in accordance with an example embodiment of the invention.

Referring to FIG. 4, a diagram illustrating a partially assembled apparatus 100 is shown in accordance with an example embodiment of the invention. The subassembly 106 and the upper housing 102 may be secured together to form a five-sided box with the connectors 108 outside the box. The plate 112 may be joined to the upper housing 102 by welding and/or gluing. The five-sided box is generally sealed in all directions except the open side 120.

The printed circuit board 110 may be disposed on the shelf 122 with one side of the printed circuit board 110 facing inward and another side facing outward through the open side 120. A continuous bead of a sealant 140 may be dispensed (or placed) round a perimeter of the open side 120. The bead of sealant 140 may overlap at least the flange 124 and the printed circuit board 110. In various embodiments, the bead of sealant 140 may also overlap the plate 112 of the subassembly 106. In some embodiments, the sealant 140 may be a room temperature vulcanizing (RTV) type of sealant. Other types of sealants may be implemented to meet the design criteria of a particular application.

Figure 5:
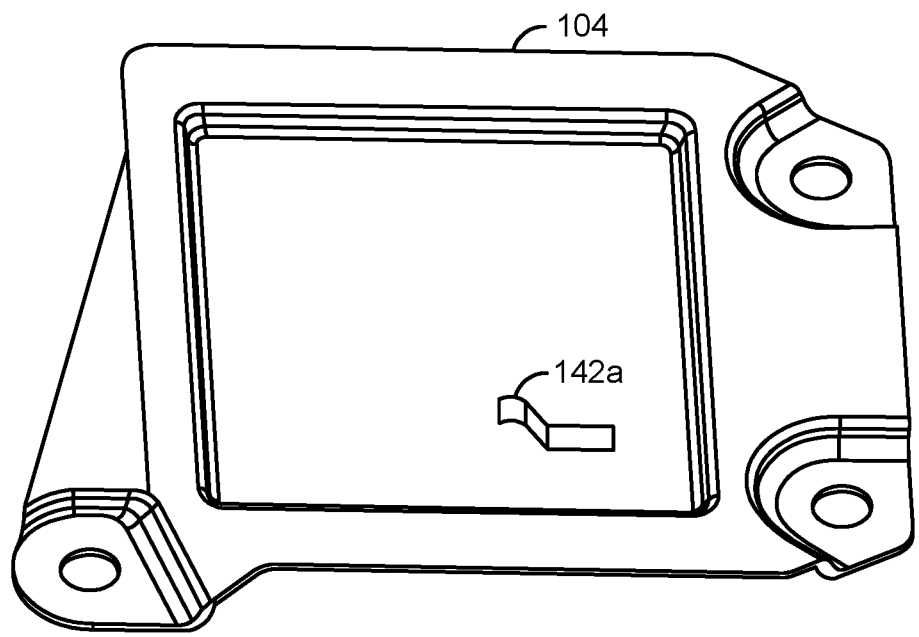
FIG. 5 is a diagram illustrating a baseplate of the apparatus in accordance with an example embodiment of the invention.

Referring to FIG. 5, a diagram illustrating an implementation of the baseplate 104 is shown in accordance with an example embodiment of the invention. The baseplate 104 generally has a larger area than the open side 120 of the upper housing 102. A spring 142a may be attached to a side of the baseplate 104 that faces the printed circuit board 110. The spring 142a may be either welded or riveted to the baseplate 104

In various embodiments, the spring 142a may be implemented as a contact spring. The contact spring 142a may be formed of an electrically conductive material (e.g., metal). The contact spring 142a may provide an electrical path from the printed circuit board 110 to the baseplate 104. The baseplate 104 may also include multiple (e.g., three) holes used to secure the apparatus 100 in place within a vehicle (or structure). The electrically conductive feature of the baseplate 104 may allow the electrical path from the printed circuit board 110 through the contact spring 142a to continue to the vehicle structure and finally to a vehicle power ground.

Figure 6:
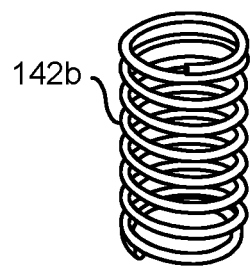
FIG. 6 is a diagram illustrating a helical spring in accordance with an example embodiment of the invention.

Referring to FIG. 6, a diagram illustrating an implementation of a helical spring 142b is shown in accordance with an example embodiment of the invention. The helical spring 142b may be implemented in place of the contact spring 142a. The helical spring 142b may be formed of an electrically conductive material (e.g., metal). The helical spring 142b may provide the electrical path from the printed circuit board 110 to the baseplate 104.

Figure 7:
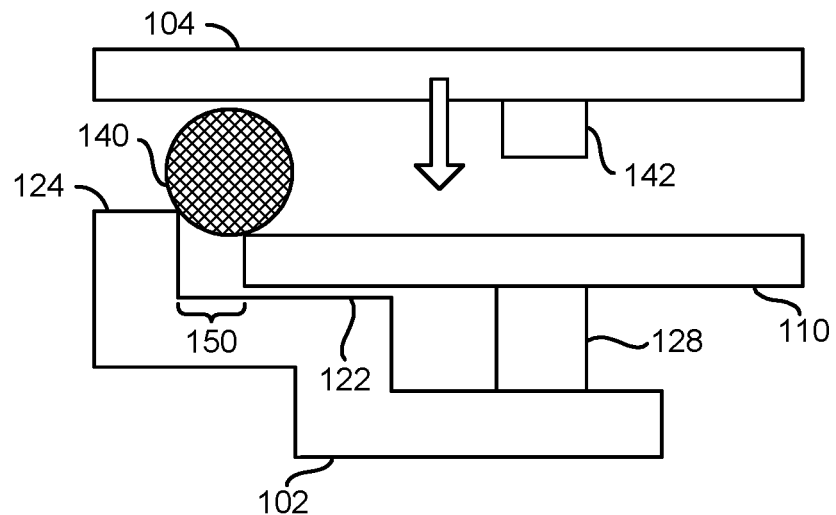
FIG. 7 is a diagram illustrating a cross-sectional view of the apparatus during assembly in accordance with an example embodiment of the invention.

Referring to FIG. 7, a diagram illustrating a cross-sectional view of the apparatus 100 during assembly is shown in accordance with an example embodiment of the invention. During assembly, the upper housing 102, with the subassembly 106 already attached, may be inverted such that the open side 120 is facing upward. With the upper housing 102 inverted, the periphery of the printed circuit board 110 may rest on the shelf 122 and inside the flange 124. A portion of the printed circuit board 110 may also rest on the support surface 128.

A gap 150 may exist between the outer edges of the printed circuit board 110 and the flange 124. The bead of sealant 140 may be posited overlapping an inner portion of the flange, the gap 150 and an outer portion of the printed circuit board 110.

The baseplate 104 may be aligned with the upper housing 102 after the bead of sealant 140 has been deposited. A spring 142 (e.g., the contact sprint 142a or the helical spring 142b) may be aligned with the support surface 128.

Figure 8:
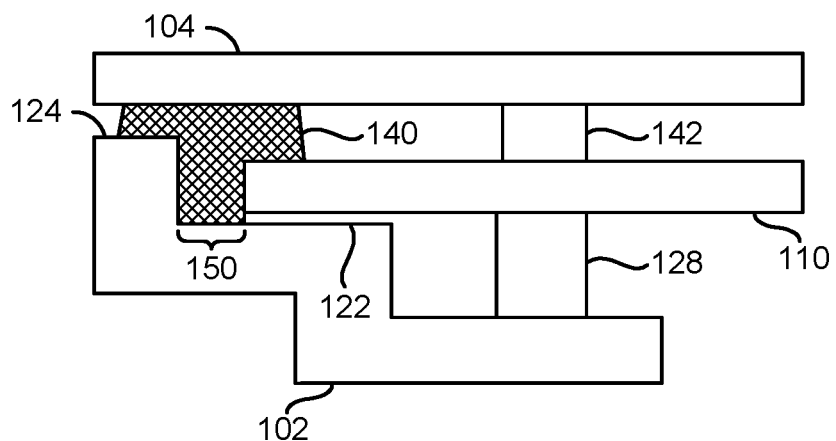
FIG. 8 is a diagram illustrating a partial cross-section of the apparatus after the baseplate has been secured to the upper housing in accordance with an example embodiment of the invention.

Referring to FIG. 8, a diagram illustrating a partial cross-section of the apparatus 100 after the baseplate 104 has been secured to the upper housing 102 is shown in accordance with an example embodiment of the invention. After the baseplate 104 has been aligned with the upper housing 102, the baseplate 104 may be pressed downward toward the upper housing 102.

The downward movement of the baseplate 104 may compress the sealant 140. The compression may force the sealant 140 into the gap 150. The sealant 140 in the gap 150 may help secure the printed circuit board 110 in place. Since the sealant 140 is flexible during most of the assembly process, tolerances between the printed circuit board 110 and the flange 124 may be looser than in common designs.

The compression may also force the sealant 140 to spread laterally across the printed circuit board 110, the flange 124 and the inside surface of the baseplate 104. The lateral flow of the sealant 140 may increase a surface area where a mechanical bond is formed between the baseplate 104 and the upper housing 102, and between the baseplate 104 and the printed circuit board 110.

The spring 142 may contact the printed circuit board 110 above the support surface 128. The support surface 128 may help prevent the printed circuit board 110 from flexing downward due to a compressive force exerted by the spring 142 and/or shocks and vibrations experienced by the apparatus 100.

Figure 9:
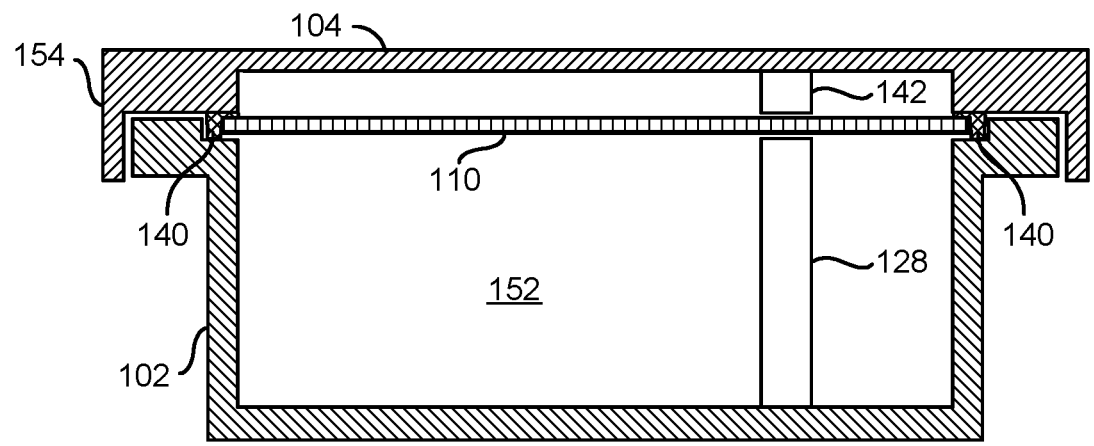
FIG. 9 is a diagram illustrating a full cross-sectional view of the apparatus as assembled in accordance with an example embodiment of the invention.

Referring to FIG. 9, a diagram illustrating a full cross-sectional view of the apparatus 100 as assembled is shown in accordance with an example embodiment of the invention. The printed circuit board 110 may be captured along the periphery by the sealant 140. A component side of the printed circuit board 110 may face toward an interior 152 of the upper housing 102. The sealant 140 generally adheres to the components as shown.

In various embodiments, the baseplate 104 may include a flange 154 that surrounds the upper housing 102. The flange 154 may limit the outward lateral movement of the sealant 140 during assembly. The flange 154 may also provide protection of the sealant 140 during normal operations in the vehicle. The compressed sealant 140 and the optional flange 154 generally provide a minimum seal against fluid penetration into the interior 152 of the upper housing 102.

Figure 10:
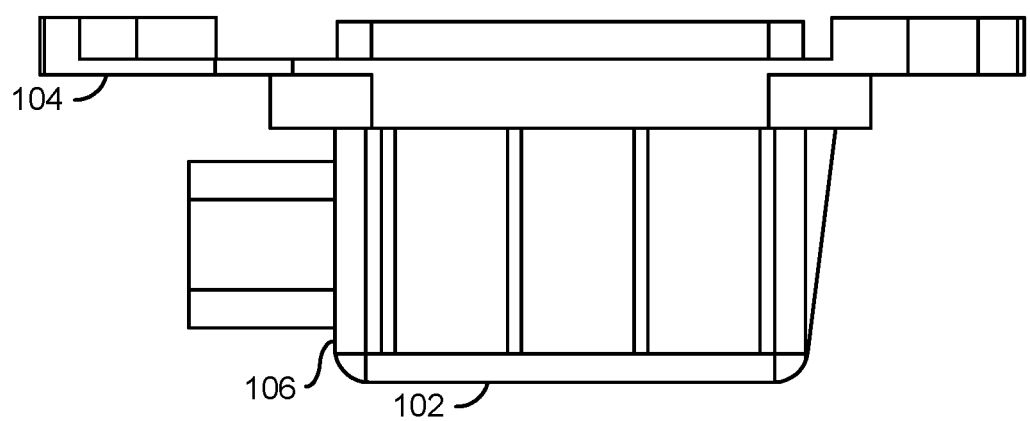
FIG. 10 is a diagram illustrating a side view of the assembled apparatus in accordance with an example embodiment of the invention.

Referring to FIG. 10, a diagram illustrating a side view of the assembled apparatus 100 is shown in accordance with an example embodiment of the invention. While the sealant 140 is being cured, the assembly 100 may be oriented as shown in FIG. 10. After the curing is complete, the apparatus 100 may be ready for testing. The apparatus 100 may be rotated 180 degrees such that the upper housing 102 is above the baseplate 104, as shown in FIG. 1. The upper housing 102 on top of the baseplate 104 may be a normal orientation while the assembly 100 is mounted in a vehicle/structure. In an example, the apparatus 100 with the enclosed printed circuit board 110 may implement a sealed bonded electronic control unit that may be compliant with international standards for intrusion protection. The standards for intrusion may include, but are not limited to, an IP 67 Intrusion Protection Rating as specified in International Electrotechnical Commission (IEC) standard 60529, and Degrees of Protection Provided by Enclosures (IP Codes)," Ed. 2.2 (Geneva: International Electrotechnical Commission, 2013), that classifies the degrees of protection provided against the intrusion of solid objects (including body parts like hands and fingers), dust, accidental contact, and water in electrical enclosures. The IP Codes may include, but are not limited to, a light water spray (e.g., IP 53), a complete immersion to a depth of 1 meter for 30 minutes (e.g., IP 67/68), and sealing to pressures up to 6 psi (e.g., IP 68). A differential pressure may be specified with the module preheated to 85° C. prior to conducting the water spray and/or the immersion testing.

Figure 11:
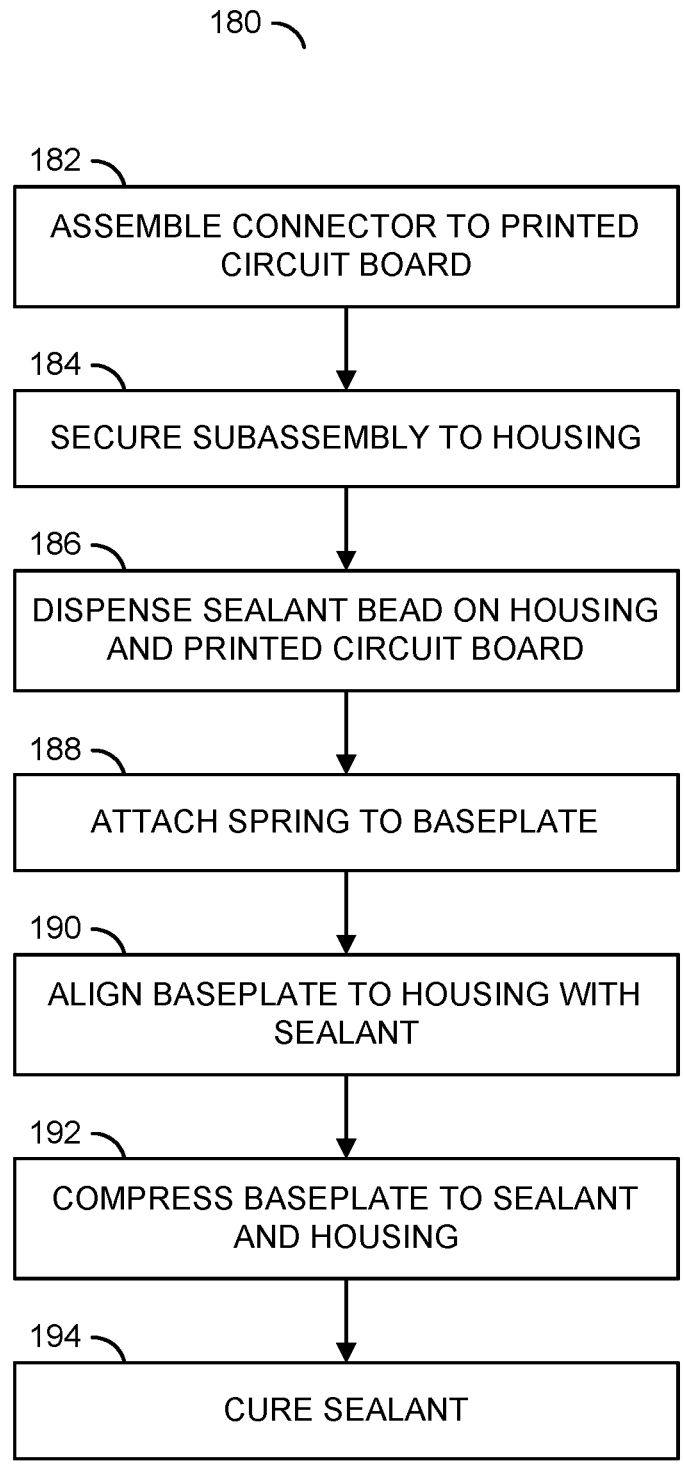
FIG. 11 is a flow diagram of a method for assembling the apparatus in accordance with an example embodiment of the invention.

Referring to FIG. 11, a flow diagram of a method 180 for assembling the apparatus 100 is shown in accordance with an example embodiment of the invention. The method (or process) 180 may be implemented in a common production facility using typical assembly equipment and techniques. The method 180 generally comprises a step (or state) 182, a step (or state) 184, a step (or state) 186, a step (or state) 188, a step (or state) 190, a step (or state) and a step (or state) 194. The sequence of the steps 182 to 194 is shown as a representative example. Other step orders may be implemented to meet the criteria of a particular application.

In the step 182, the connectors 108, and associated parts 112 and 114, may be assembled with the printed circuit board 110 to form the subassembly 106. In various embodiments, electrical testing of the subassembly 106 may be included in the step 182. The subassembly 106 may subsequently be secured to the upper housing 102 in the step 184. In various embodiments, the subassembly 106 may be secured to the upper housing 102 using a typical welding technique. In other embodiments, the subassembly 106 may be glued to the upper housing 102 with commercially available glue. A five-sided box may be formed when the upper housing 102 and the subassembly 106 are joined. The upper housing 102, with the attached subassembly 106, may subsequently be oriented with the open side 120/back side of the printed circuit board 110 facing upward.

In the step 186, the continuous bead of the sealant 140 may be dispensed on the upper housing 102 and the printed circuit board 110 (an optionally the plate 112). The spring 142 may be attached to the baseplate 104 in the step 188. In various embodiments, the step 188 may occur before, concurrently, or after any one or more of the steps 182-186.

The baseplate 104 may be aligned to the upper housing 102 with the sealant 140 already applied in the step 190. In the step 192, the baseplate 104 may be compressed to the sealant 140 and the upper housing 102. The baseplate 104 may close the open side 120 of the five-sided box. The compression may cause the sealant 140 to flow into the gap 150 (see FIG. 8) and spread across the printed circuit board 110. In the step 194, the sealant 140 may be hardened by a curing process while the baseplate 104 and the upper housing 102 are held together. The cured sealant 140 generally bonds the baseplate 104, the upper housing 102 and the printed circuit board 110 together. The curing process may include, but is not limited to, heat curing, humidity curing, ultra-violet light curing and/or chemical curing. Once the curing is complete, the apparatus 100 may be optionally tested.

During the curing process, the baseplate 104 and the upper housing 102 may be held together by one or more mechanisms. In various embodiments, snap fit features and/or threaded fasteners may be used to maintain the spatial relationship between the upper housing 102 and the baseplate 104 while the sealant 140 is still pliable.

Figure 12:
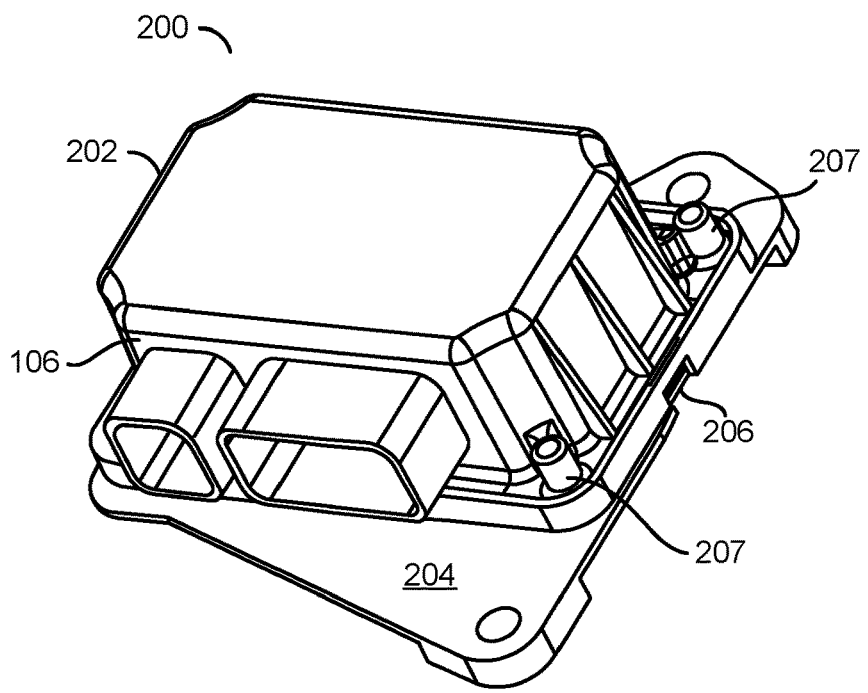
FIG. 12 is a diagram illustrating a perspective view of another apparatus in accordance with an example embodiment of the invention.

Referring to FIG. 12, a diagram illustrating a perspective view of another apparatus 200 is shown in accordance with an example embodiment of the invention. The apparatus 200 may be a variation of the apparatus 100. The apparatus (or module) 200 generally comprises the subassembly 106, an upper housing 202 and a lower housing (or cover or baseplate) 204. The upper housing 202 may be a variation of the upper housing 102. The baseplate 204 may be a variation of the baseplate 104. In some variations, the upper housing 202 may include a plurality of optional tabs 206 (one visible in the figure) distributed around a lower edge of the upper housing 202. In some configurations, the upper housing 202 may also include a plurality of optional sockets 207 (two visible in the figure) distributed around an external perimeter of the upper housing 202.

The tabs 206 may be configured to engage openings in the lower housing 204 to provide a snap fit that provides a clamping force to the sealant 140 disposed between the upper housing 202 and the lower housing 204. When engaged, the tabs 206 may hold the upper housing 202 and the lower housing 204 in alignment while the sealant 140 cures. In some embodiments, the tabs 206 may be implemented without the sockets 207. In other embodiments, both the tabs 206 and the sockets 207 may be implemented.

The sockets 207 may be configures to receive threaded fasteners (e.g., screws). While the upper housing 202 and the baseplate 204 are aligned to each other, the threaded fasteners may be inserted into holes in the baseplate 204 and secured to threads inside the sockets 207 in the upper housing 204. Alternatively, the threaded fasteners may be inserted into the sockets 207 and secured to threads in the baseplate 204. In some embodiments, the sockets 207 may be implemented without the tabs 206. The threaded fasteners may be tightened before, during or after the upper housing 202 and the baseplate 204 have been compressed together. Once fully tightened, the threaded fasteners may hold the upper housing 202 and the lower housing 204 in alignment while the sealant 140 cures.

Figure 13:
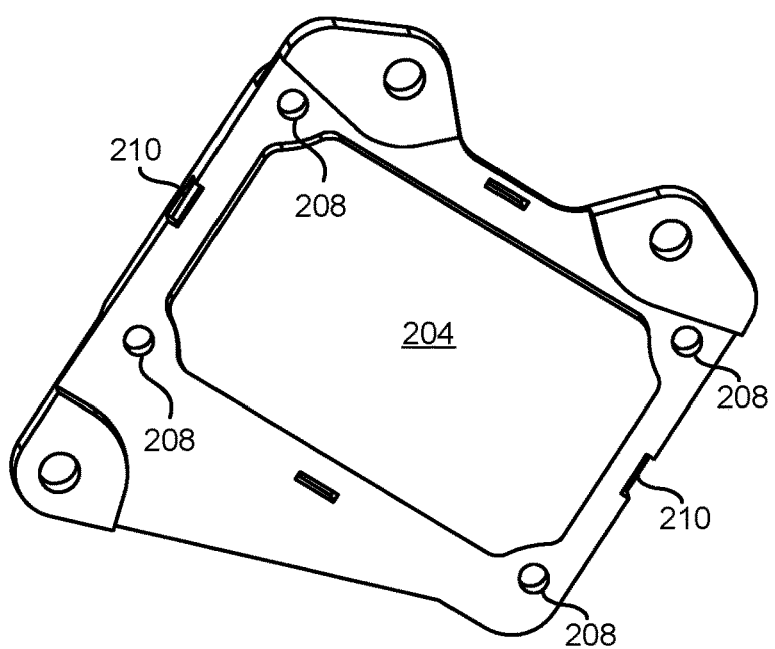
FIG. 13 is a diagram illustrating a perspective view of a baseplate of FIG. 12 in accordance with an example embodiment of the invention.

Referring to FIG. 13, a diagram illustrating a perspective view of the baseplate 204 is shown in accordance with an example embodiment of the invention. The baseplate 204 generally comprises a plurality of optional sockets 208 and a plurality of optional openings 210. The sockets 208 are generally implemented in configurations where the upper housing 202 includes the sockets 207. The openings 210 may be implemented in configuration where the upper housing 202 includes the tabs 206.

The sockets 208 may be configured to receive the threaded fasteners (e.g., screws) used to securely assemble the upper housing 202 to the baseplate 204. In some embodiments, the sockets 208 may include threads to secure the threaded fasteners inserted through the sockets 207 of the upper housing 202. In other embodiments, the sockets 208 may be smooth bores that allow the threaded fasteners to pass through and screw into the sockets 207 of the upper housing 202.

Figure 14:
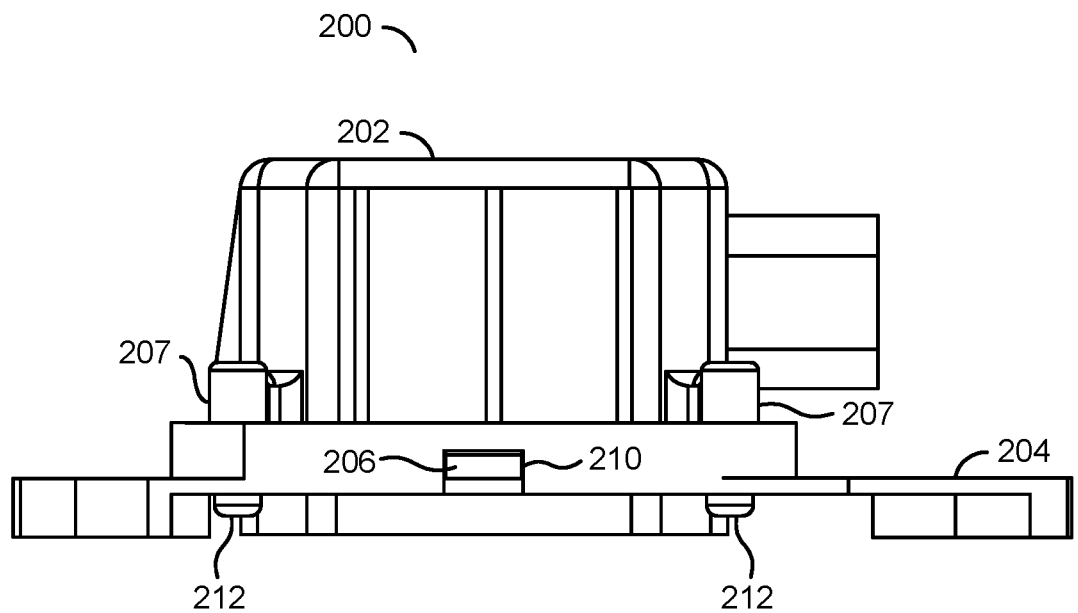
FIG. 14 is a diagram illustrating a side view of the assembled apparatus of FIG. 12 in accordance with an example embodiment of the invention

Referring to FIG. 14, a diagram illustrating a side view of the assembled apparatus 200 is shown in accordance with an example embodiment of the invention. When the upper housing 202 is assembled to the baseplate 204, the tabs 206 of the upper housing 202 (where implemented) may engage the openings 210 of the baseplate 204 to provide the snap fit that retains the upper housing 202 to the baseplate 204. The threaded fasteners 212 (where implemented) may be used to secure the upper housing 202 to the baseplate 204.

A predefined amount of torque may be applied to the threaded fasteners 212 to perfect a desired clamping force between the upper housing 202 to the baseplate 204. In an example, the threaded fasteners 212 may be tightened (torqued) to provide a clamping force of 67 N per screw. Other amounts of torque may be applied to meet the design criteria of a particular application.

Figure 15:
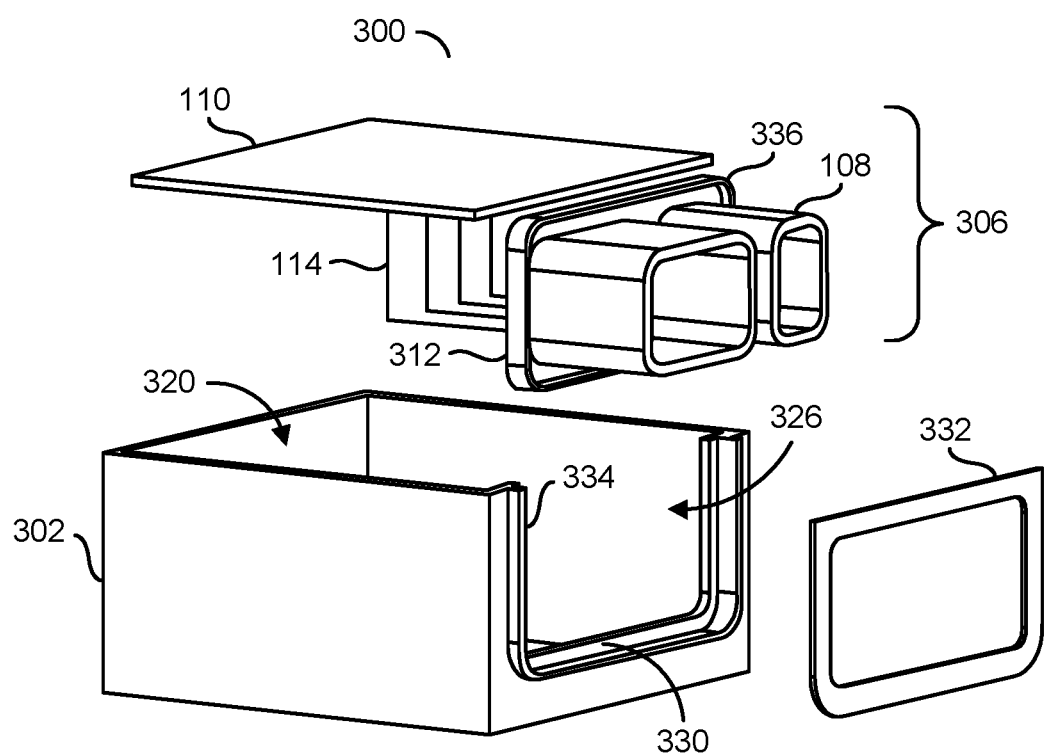
FIG. 15 is a diagram illustrating a portion of yet another apparatus in accordance with an example embodiment of the invention.

Referring to FIG. 15, a diagram illustrating an implementation of a portion of an apparatus 300 is shown in accordance with an example embodiment of the invention. The apparatus 300 may be a variation of the apparatus 100 and/or the apparatus 200. The apparatus (or module) 300 generally comprises a subassembly 306, an upper housing 302, a lower housing (or cover or baseplate) not shown, and a weld ring (or part) 332.

The upper housing 302 may be a variation of the upper housing 102 and/or the upper housing 202. In some variations, the upper housing 302 may include an open side 320, an open connector side 326, an interface 330, a housing weld rib 334, the shelf 122 (not shown), the flange 124 (not shown) and the support surface 128 (not shown). The open side 320 may be a variation of the open side 120. The open connector side 326 may be a variation of the open connector side 126. The interface 330 may be a variation of the interface 130. In various embodiments, the upper housing 302 may include the tabs 206 and/or the sockets 207 (illustrated in FIG. 12).

The subassembly 306 may be a variation of the subassembly 106. The subassembly 306 generally comprises the one or more connectors 108, the one or more printed circuit boards 110, the wires 114 and a plate 312. The printed circuit boards 110 may be connected to pins and/or sockets in the connectors 108 by the wires 114.

The plate 312 may be a variation of the plate 112. The plate 312 may include a connector weld rib 336. In various embodiments, the plate 312 may be formed integral to the connectors 108 to form a sealed surface. In other embodiments, the plate 312 may be formed separate from the connectors 108 and subsequently joined together.

The open connector side 326 may have the interface 330 shaped to receive the plate 312 of the subassembly 306. In various embodiments, the plate 312 of the subassembly 306 may be configured to completely cover the open connector side 326 of the upper housing 302.

The weld ring 332 may be configured to pass around the connectors 108 and physically connect to the housing weld rib 334 and the connector weld rib 336. The weld ring 332 may be attached to the weld ribs 334 and 336 after the subassembly 306 has been positioned in the upper housing 302. The upper housing 302 may support the plate 312 from welding forces applied during a welding process.

The housing weld rib 334 may face outward from the upper housing 302. The housing weld rib 334 may follow a perimeter along three sides of the interface 330. The housing weld rib 334 is generally configured to be welded to the weld ring 332.

The connector weld rib 336 may be formed around a perimeter of the plate 312. The connector rib 336 may face away from the upper housing 302. The connector weld rib 336 is generally configured to be welded to the weld ring 332.

Figure 16:
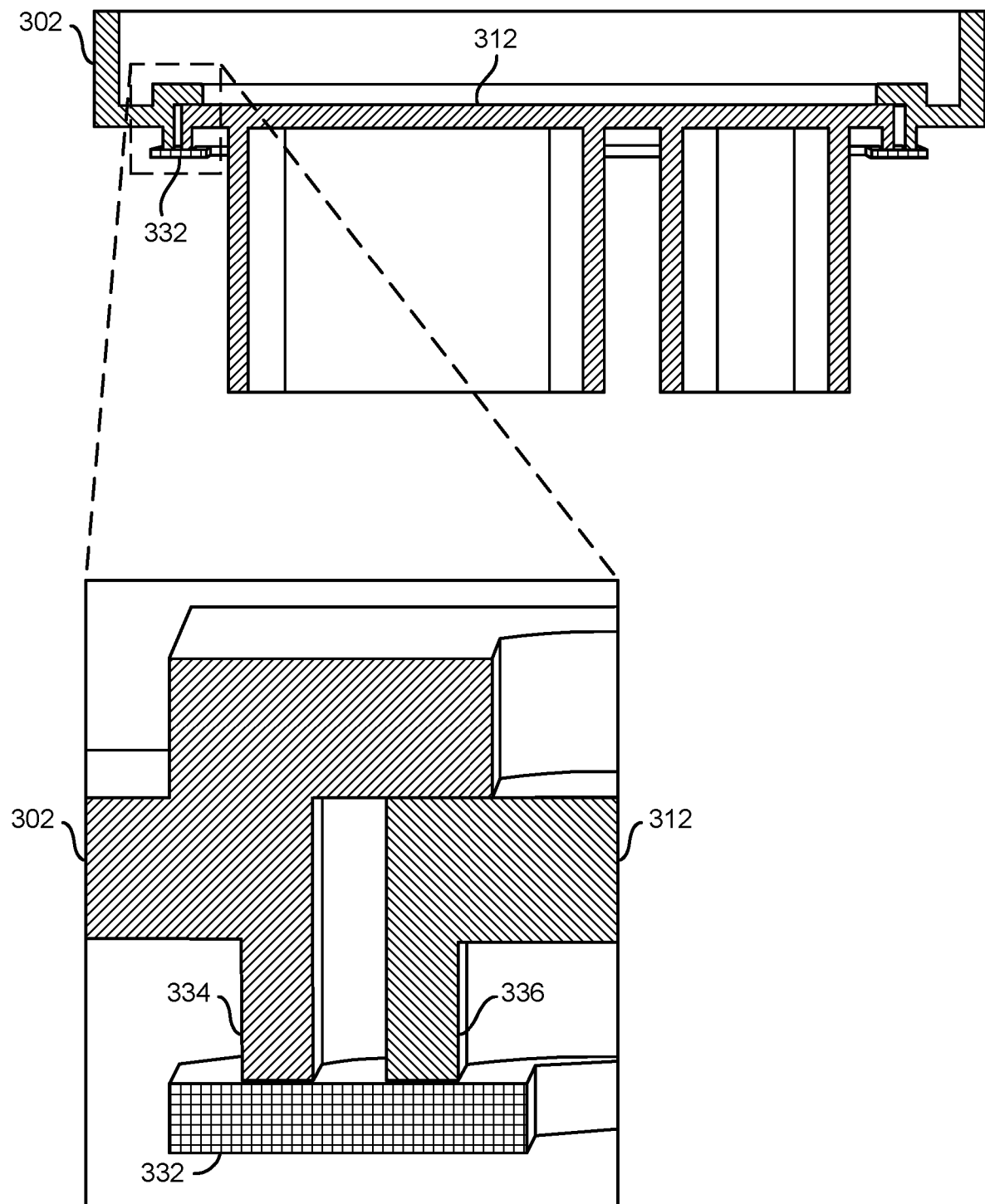
FIG. 16 is a diagram illustrating a cross-sectional view of a portion of the apparatus of FIG. 15 in accordance with an example embodiment of the invention.

Referring to FIG. 16, a diagram illustrating a cross-sectional view of a portion of the apparatus 300 is shown in accordance with an example embodiment of the invention. The plate 312 may be disposed in the interface 330 (FIG. 15) of the upper housing 302. The weld ring 332 may be in physical contact with the weld ribs 334-336.

The weld ring 332 and weld ribs 334-336 generally eliminate any relative motion between the upper housing 302 and the plate 312 during the welding process. During the welding process, only the weld rib 334—on the upper housing 302 and the weld rib 336 on the plate 312 may melt, and so only the weld ring 332 and the weld ribs 334-336 may move. Since a welding laser light only passes through the weld ring 322, the plate 312 may be made of a material that does not readily transmit the welding laser light.

Figure 17:
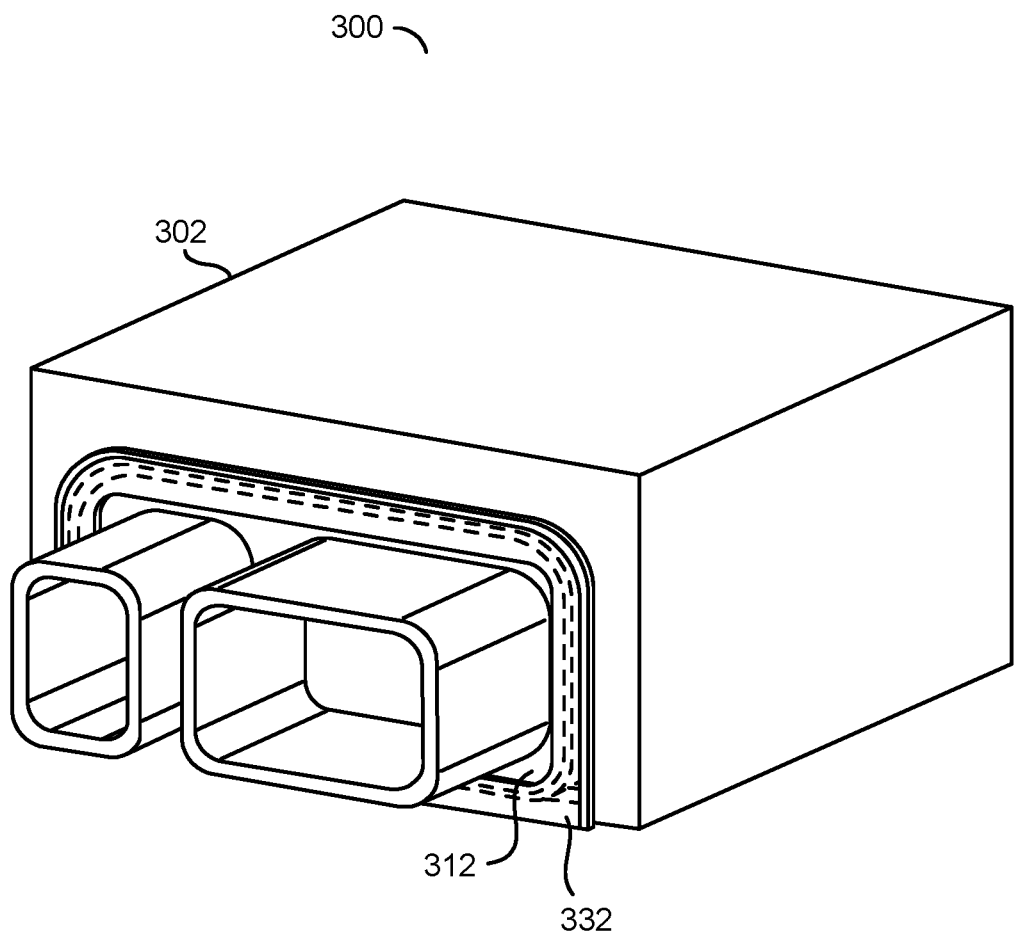
FIG. 17 is a diagram illustrating a perspective view of a portion of the apparatus of FIG. 15 after assembly in accordance with an example embodiment of the invention.

Referring to FIG. 17, a diagram illustrating a perspective view of a portion of the apparatus 300 after assembly is shown in accordance with an example embodiment of the invention. The weld ring 332 may provide a permanent connection between the plate 312 and the upper housing 302.

The weld ring 322 and the weld ribs 334-336 may provide a structurally robust interface between the upper housing 302 and the subassembly 306. Aside from the weld ribs 334-336, no other motion may be experienced by the upper housing 302 and the subassembly 306. Once welded in place, the weld ring 322 generally seals the subassembly 306 to the upper housing 302. If an unsealed version of the assembly 300 is designed, the weld ring 322 may be omitted without the loss of any functionality.

Figure 18:
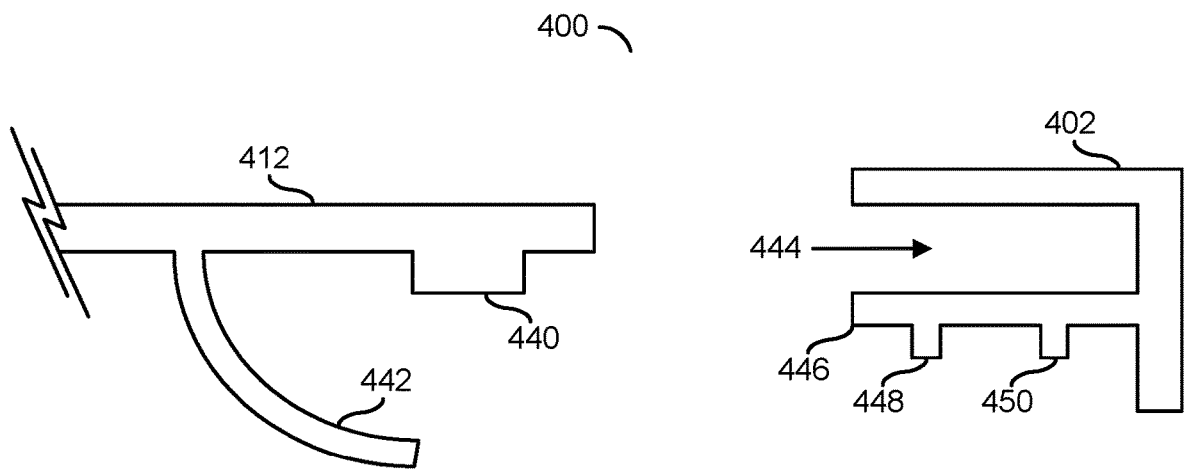
FIG. 18 is a diagram illustrating a part of another apparatus in accordance with an example embodiment of the invention.

Referring to FIG. 18, a diagram illustrating a part of another apparatus 400 is shown in accordance with an example embodiment of the invention. The apparatus 400 may be a variation of the apparatus 100, the apparatus 200 and/or the apparatus 300. The apparatus (or module) 400 generally includes an upper housing 402, the subassembly (not shown) and the baseplate (not shown). The upper housing 402 may be a variation of the upper housings 102, 202 and/or 302. The subassembly may be a variation of the subassemblies 106 and/or 306. The subassembly may include a plate 412. The plate 412 may be a variation of the plates 112 and/or 312. The apparatus 400 generally illustrates a spring loaded design that may have a flexible feature to provide a tight fit between the upper housing 402 and the plate 412. In various embodiments, the upper housing 402 may be laser opaque. In other embodiments, the upper housing 402 may be laser translucent.

The plate 412 generally includes a tab 440 and a flexible member 442. The tab 440 and the flexible member 442 may extend around the three sides of the plate 412 that contact the upper housing 402.

The upper housing 402 generally comprises a groove (or slot) 444, a corner 446, an optional ridge 448 and another optional ridge 450. The groove 444, the corner 446, the ridge 448 and the ridge 450 may extend around the three sides of the upper housing that contact the plate 412. The groove 444 may be shaped such that the tab 440 of the plate 412 may be inserted into the groove 444.

Figure 19:
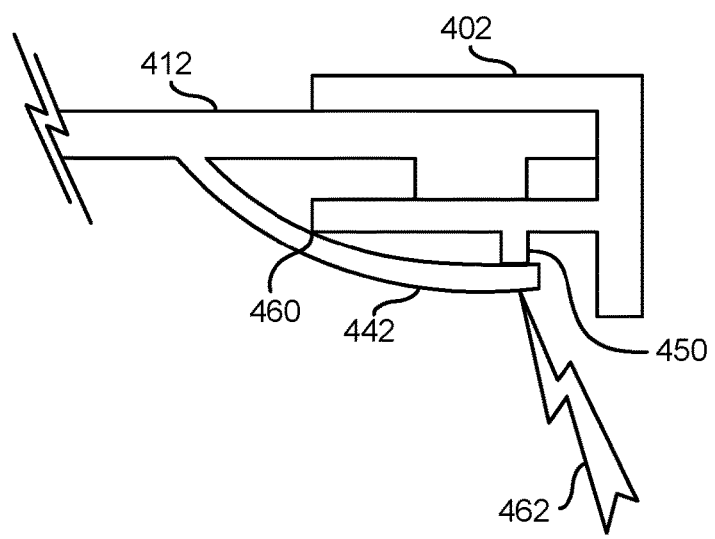
FIG. 19 is a diagram illustrating a spring loaded weld in accordance with an example embodiment of the invention.

Referring to FIG. 19, a diagram illustrating a spring loaded weld is shown in accordance with an example embodiment of the invention. The spring loaded design of FIG. 19 generally has the tab 442 of the plate 412 inserted into the groove 444 along three sides of the upper housing 402. In some embodiments, the design illustrated may not include the ridge 448. A free end of the flexible member 442 may normally extend away from the ridge 450 (shown), and if implemented, the ridge 448 (not shown). The flexible member 442 may be bent until contact is made with the ridge 450. While bent, the flexible member 442 may also press against the corner 446 to provide a pre-load (or interference) point 460. The pre-load point 460 generally provides a tight fit between the plate 412 and the upper housing 402. A welding laser light 462 may be used to weld the flexible member 442 to the ridge 450 of the upper housing 402. The welding laser light 462 may be directed through the flexible member 442. The resulting weld may meet the sealing criteria between the components 402 and 412 and may increase a mechanical retention.

Figure 20:
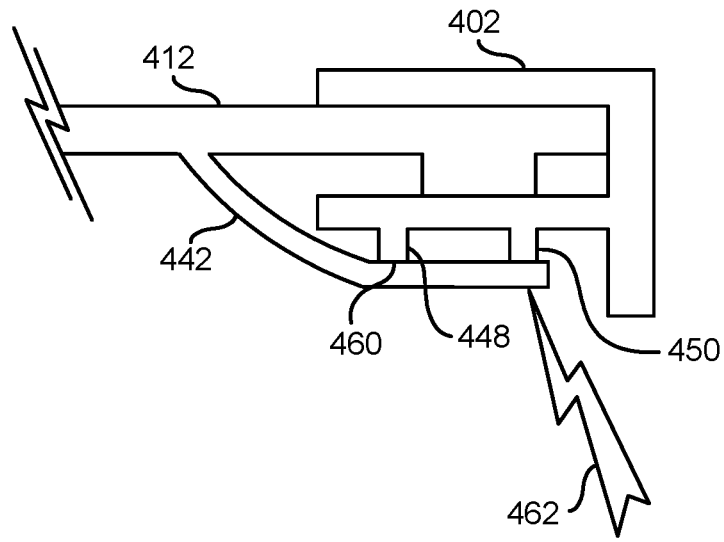
FIG. 20 is a diagram illustrating another spring loaded weld in accordance with an example embodiment of the invention.

Referring to FIG. 20, a diagram illustrating another spring loaded weld is shown in accordance with an example embodiment of the invention. The spring loaded design of FIG. 20 generally has the tab 442 of the plate 412 inserted into the groove 444 along three sides of the upper housing 402. The free end of the flexible member 442 may normally extend away from the ridge 448 and the ridge 450. The flexible member 442 may be bent until contact is made with the ridge 448 and the ridge 450. While bent, the flexible member 442 may press against the ridge 448 to provide the pre-load point 460. The welding laser light 462 may be used to weld the flexible member 442 to the ridge 450. The welding laser light 462 may be directed through the flexible member 442. The resulting weld may meet the sealing criteria between the components 402 and 412 and may increase the mechanical retention.

Figure 21:
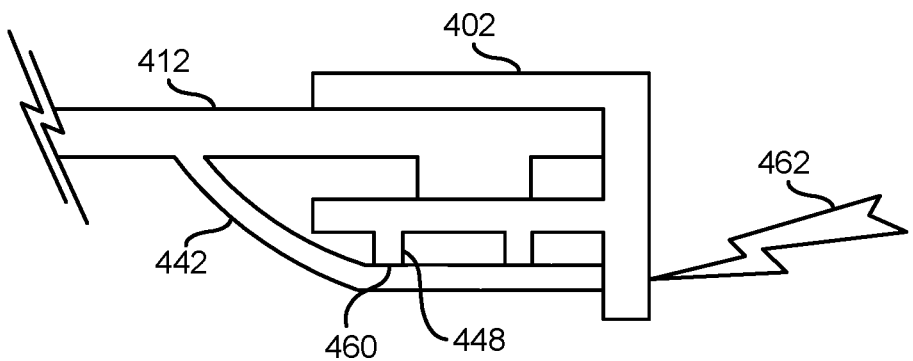
FIG. 21 is a diagram illustrating yet another spring loaded weld in accordance with an example embodiment of the invention.

Referring to FIG. 21, a diagram illustrating yet another spring loaded weld is shown in accordance with an example embodiment of the invention. The spring loaded design of FIG. 21 generally has the tab 442 of the plate 412 inserted into the groove 444 along three sides of the upper housing 402. In some embodiments, the design illustrated may not include the ridge 450. The free end of the flexible member 442 may normally extend away from the ridge 448, and if implemented, the ridge 450. The flexible member 442 may be bent until contact is made with the ridge 448 and an outside edge of the upper housing 402. While bent, the flexible member 442 may press against the ridge 448 to provide the pre-load point 460. The welding laser light 462 may be used to weld the flexible member 442 to the outside edge of the upper housing 402. The welding laser light 462 may be directed through the upper housing 402. The resulting weld may satisfy the sealing criteria between the components 402 and 412 and may increase the mechanical retention.

Figure 22:
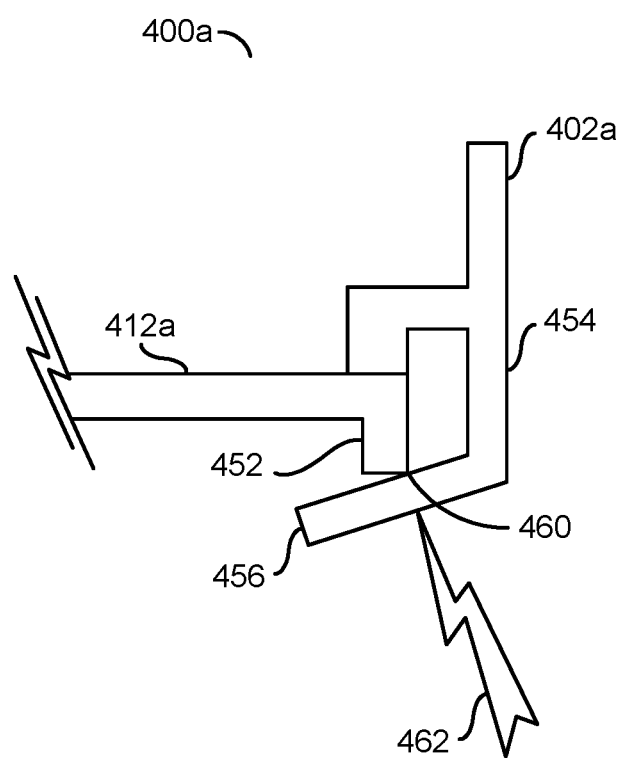
FIG. 22 is a diagram illustrating a part of still another apparatus in accordance with an example embodiment of the invention.

Referring to FIG. 22, a diagram illustrating a part of an apparatus 400a is shown in accordance with an example embodiment of the invention. The apparatus 400a may be a variation of the apparatus 100, the apparatus 200, the apparatus 300 and/or the apparatus 400. The apparatus (or module) 400a generally includes an upper housing 402a, the subassembly (not shown) and the baseplate (not shown). The upper housing 402a may be a variation of the upper housings 102, 202, 302 and/or 402. The subassembly may be a variation of the subassemblies 106 and/or 306. The subassembly may include a plate 412a. The plate 412a may be a variation of the plates 112, 312 and/or 412. The apparatus 400a generally illustrates a spring loaded design that may have a flexible feature on the upper housing 402a to provide a tight fit between the upper housing 402a and the plate 412a. In various embodiments, the upper housing 402a may be laser translucent.

The plate 412a generally includes ridge 452. The ridge 452 may extend around the three sides of the plate 412a that contact the upper housing 402a.

The upper housing 402a generally comprises the groove 444 (see FIG. 18), a flange 454, and a beam 456. The groove 444, the flange 454 and the beam 456 may extend around the three sides of the upper housing 402a that contact the plate 412a. The groove 444 may be shaped such that the ridge 452 of the plate 412a may be inserted into the groove 444.

With the plate 412a and the ridge 452 mated to the upper housing 402a, a free end of the beam 456 may be bent by the ridge 452 away from the plate 412a. While bent, the beam 456 may press against a corner of the ridge 452 to provide the pre-load (or interference) point 460. The pre-load point 460 generally provides a tight fit between the plate 412a and the upper housing 402a. The welding laser light 462 may be used to weld the beam 456 to the ridge 452. The welding laser light 462 may be directed through the beam 456. The resulting weld may meet the sealing criteria between the components 402a and 412a and may increase the mechanical retention.

The pre-loading designs generally eliminate relative motion between the connector and the upper housing. The pre-loading designs may provide a structurally robust interface between the upper housing and the connector. In various embodiments, the only function of the weld may be for sealing. If an unsealed version of the module is desired, the weld process may be omitted.

The apparatus 100/200/300/400/400a generally provided several advantages over conventional designs. In particular, no screws may be used in the apparatus, so no steps may be performed to seal around corresponding screw pockets. Furthermore, no metal inserts may be adapted in the upper housing for the screws. Mechanical fastening of the printed circuit board to the upper housing may be made by the sealant. The assembly may pass IP67 testing and higher sealing criteria.

If the fasteners are implemented to hold the upper housing and the baseplate together during the lifetime of the assembly, the fasteners may be included outboard the sealed area. The fasteners may include, but are not limited to, the tabs and the openings, the screws and/or a press-fit design for complete assembly.

Since the baseplate may be made of an electrically conductive material (e.g., metal), the electromagnetic compatibility (EMC) performance of the apparatus may be enhanced. The combined connectors/plate may be welded to the upper housing, thereby forming a sealed module and keeping the connectors in place. The method 180 may also be used to weld or adhere a plastic-type baseplate to the upper housing.

The design and assembly techniques of the apparatus 100/200/300/400/400a may have advantages of being cost effective and improving on the performance of the module (with respect to sealing, mechanical transfer function, and EMC performance). The welding/gluing of the subassembly to the upper housing may avoid dispensing the sealant at the connector plate to housing interface. Larger part and assembly tolerances may be allowed since the dispensed sealant may absorb component variations. Furthermore, a single sealant dispensing operation may be implemented to seal the entire module.

A metal-type baseplate may provide enhanced mechanical transfer function (MTF) compared to ECU designs with plastic housings and plastic covers. The apparatus may have a lower cost than similar housings where the connector is over-molded in the housing. An increased area for electronic components on the printed circuit board may be provided since no fasteners are going through the printed circuit board or through the interior of the enclosure.

The method 180 may also enable a simpler assembly line, since the connectors may be fully sealed to the upper housing when attached to the upper housing. The welding/gluing of the subassembly to the upper housing may provide a robust seal between upper housing and the connectors and plate. The final apparatus may be mechanically strong since the connectors and plate may now be structural components when welded/glued to the upper housing.

The functions and structures illustrated in the diagrams of FIGS. 1-22 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a housing having a shelf and a flange along an open side;
    a circuit board (i) disposed on said shelf of said housing and inside said flange of said housing and (ii) secured to said housing;
    a continuous bead of sealant dispensed (i) through said open side of said housing and (ii) along a gap between said flange and said circuit board around a perimeter of said circuit board; and
    a baseplate compressed against said open side of said housing thereby causing said continuous bead of sealant to flow between (i) said baseplate, (ii) said circuit board, and (iii) said flange.

2. The apparatus according to claim 1, wherein said sealant is cured to bond said circuit board, said housing and said baseplate together as an electronic control unit.

3. The apparatus according to claim 1, further comprising a connector and a plurality of compliant pins having a right angle bend assembled to said circuit board, wherein said connector fits into a connector opening in a side of said housing orthogonal to said open side.

4. The apparatus according to claim 3, wherein an interface between said connector and said connector opening in said side of said housing is free of said sealant.

5. The apparatus according to claim 3, wherein said connector is welded to said housing.

6. The apparatus according to claim 3, further comprising a weld ring overlapping an interface between said connector and said connector opening in said side of said housing, wherein said weld ring is welded to a housing weld rib of said housing and a connector weld rib of said connector, and seals said interface between said connector and said housing.

7. The apparatus according to claim 1, wherein said housing is secured to said baseplate solely by said sealant.

8. The apparatus according to claim 1, further comprising one or more fasteners configured to secure said housing to said baseplate outside of said sealant.

9. The apparatus according to claim 1, wherein said baseplate is aligned to said open side of said housing with said sealant already applied prior to said compression of said baseplate to said housing.

10. The apparatus according to claim 1, wherein said sealant is cured by at least one of heat curing, humidity curing, ultra-violet light curing, and chemical curing.

11. The apparatus according to claim 10, wherein said sealant provides a seal against fluid penetration into an interior of said housing.

12. A method for assembling an electronic control unit, comprising the steps of:
    securing a circuit board to a housing, wherein (i) said housing has a shelf and a flange along an open side and (ii) said circuit board is disposed on said shelf and inside said flange;
    dispensing a continuous bead of sealant (i) through said open side of said housing and (ii) along a gap between said flange and said circuit board around a perimeter of said circuit board; and
    compressing a baseplate against said open side of said housing thereby causing said continuous bead of sealant to flow between (i) said baseplate, (ii) said circuit board, and (iii) said flange.

13. The method according to claim 12, further comprising the step of:
    curing said sealant to bond said circuit board, said housing and said baseplate together as said electronic control unit.

14. The method according to claim 12, further comprising the step of:
    assembling a connector and a plurality of compliant pins having a right angle bend to said circuit board to create a subassembly prior to said circuit board being disposed on said shelf, wherein said connector fits into a connector opening in a side of said housing orthogonal to said open side.

15. The method according to claim 14, wherein an interface between said connector and said housing is free of said sealant.

16. The method according to claim 12, wherein said housing is secured to said baseplate solely by said sealant.

17. The method according to claim 12, further comprising the step of:
    securing said housing to said baseplate outside of said sealant using one or more fasteners.

18. The method according to claim 12, further comprising the step of:
    aligning said baseplate to said open side of said housing with said sealant already applied prior to said compression of said baseplate to said housing.

19. The method according to claim 12, wherein said sealant is cured by at least one of heat curing, humidity curing, ultra-violet light curing, and chemical curing.

20. The method according to claim 19, wherein said sealant provides a seal against fluid penetration into an interior of said housing.

* * * * *